(12) United States Patent
Lin et al.

(10) Patent No.: US 10,341,029 B2
(45) Date of Patent: Jul. 2, 2019

(54) OPTOELECTRONIC RECEIVER CIRCUIT WITH DARK CURRENT CORRECTION FUNCTION AND DARK CURRENT CORRECTION METHOD THEREOF

(71) Applicant: DYNA IMAGE CORP., New Taipei (TW)

(72) Inventors: Wen-Sheng Lin, New Taipei (TW); Sheng-Cheng Lee, New Taipei (TW)

(73) Assignee: DYNA IMAGE CORP. (TW)

( * ) Notice: Subject to any disclaimer, the term of this patent is extended or adjusted under 35 U.S.C. 154(b) by 140 days.

(21) Appl. No.: 15/799,448

(22) Filed: Oct. 31, 2017

(65) Prior Publication Data

US 2019/0097733 A1 Mar. 28, 2019

(30) Foreign Application Priority Data

Sep. 27, 2017 (CN) .......................... 2017 1 0890039

(51) Int. Cl.
  *G01J 1/44* (2006.01)
  *H04B 10/60* (2013.01)
  *H01L 27/146* (2006.01)
  *G01J 1/42* (2006.01)

(52) U.S. Cl.
  CPC ............ *H04B 10/60* (2013.01); *G01J 1/4228* (2013.01); *G01J 1/44* (2013.01); *H01L 27/14643* (2013.01); *G01J 2001/444* (2013.01)

(58) Field of Classification Search
  CPC ... G01J 1/42; G01J 1/4228; G01J 1/44; H04B 10/40
  USPC .......................... 250/214 R, 214 C, 214 SW
  See application file for complete search history.

(56) References Cited

U.S. PATENT DOCUMENTS

2018/0234096 A1* 8/2018 Li .......................... H03K 17/78
2018/0266879 A1* 9/2018 Lee ....................... G01J 1/4204

* cited by examiner

*Primary Examiner* — Kevin K Pyo

(57) ABSTRACT

The present invention mainly discloses an optoelectronic receiver circuit with dark current correction function, comprising: a transimpedance amplifier (TIA), a first variable resistor, a second variable resistor, a photodiode, a leakage compensation photodiode, at least one first leakage correction photodiode, at least one first switch, at least one second leakage correction photodiode, and at least one second switch. In the present invention, the first switch and the second switch are used for enabling the first leakage correction photodiode and the second leakage correction photodiode when the dark current of the leakage compensation photodiode cannot fully cancel a leakage portion of a photodiode current of the photodiode, such that the leakage portion of the photodiode current can be completely eliminated by the dark current of the leakage compensation photodiode and the dark currents provided by the two leakage correction photodiodes.

6 Claims, 7 Drawing Sheets

Providing an optoelectronic receiver circuit comprising:

a transimpedance amplifier (TIA);

a first variable resistor electrically connected between a positive input end and a negative output end of the TIA;

a second variable resistor electrically connected between a negative input end and a positive output end of the TIA;

a photodiode electrically connected to the positive input end of the TIA;

a leakage compensation photodiode electrically connected to the negative input end of the TIA;

a plurality of first leakage correction photodiodes electrically connected to the positive input end of the TIA, and electrically connected in parallel with the photodiode;

a plurality of first switches, wherein any one of the first switches is connected between a corresponding one of the first leakage correction photodiodes and the positive input end of the TIA;

a plurality of second leakage correction photodiodes electrically connected to the negative input end of the TIA, and electrically connected in parallel with the leakage compensation photodiode; and a plurality of second switches, wherein any one of the second switches is connected between a corresponding one of the second leakage correction photodiodes and the negative input end of the TIA

OPTOELECTRONIC RECEIVER CIRCUIT WITH DARK CURRENT CORRECTION FUNCTION AND DARK CURRENT CORRECTION METHOD THEREOF

BACKGROUND OF THE INVENTION

1. Field of the Invention

The present invention relates to the technology field of electronic circuits, and more particularly to an optoelectronic receiver circuit with dark current correction function and a dark current correction method for the optoelectronic receiver circuit.

2. Description of the Prior Art

Optical communication system has advantages of high communication capacity, low transmission loss, small size, light weight, and not easily be subject to electromagnetic interference (EMI), and already become the main transmission framework in high-speed internet-based networks. FIG. 1 illustrates a circuit framework diagram of a conventional optical communication system. As FIG. 1 shows, conventional optical communication system 1' comprises an optical transmitting module 11', an optical receiving module 12', and an optical fiber 13' for making the optical transmitting module 11' communicate with the optical receiving module 12'. In the circuit framework of FIG. 1, the optical transmitting module 11' at least comprises a driver unit 111' and a laser diode (LD) 112'; moreover, the optical receiving module 12' comprises a photodiode (PD) 121', a transimpedance amplifier (TIA) 122', a limiting amplifier (LA) 123', and a clock and data recovery (CDR) unit 124'.

Modern complementary metal oxide semiconductor (CMOS) process is utilized to manufacture the photodiodes 121' with different structures. FIG. 2 shows cross-sectional diagram of a photodiode with N-well/P-sub structure, FIG. 3 displays cross-sectional diagram of a photodiode with N+/P-sub structure, and FIG. 4 exhibits cross-sectional diagram of a photodiode with P+/N-well/P-sub structure. It is well known that the photodiodes 121' is reversely biased at a photo-conduction mode for the application of the optical receiving module 12'. Therefore, the photodiodes 121' would produce a reverse current called photodiode (PD) current after receiving a light with specific intensity. It is worth noting that, since the photodiodes 121' is controlled at a reverse bias operation, the photodiodes 121' still would produce a reverse saturation current called dark current even through there is no light impingement upon the photodiodes 121'.

Electronic engineers skilled in development and manufacture of optical receiver circuits and/or ambient light sensing circuits should know that the dark current is a time-invariant noise easily influenced by temperature. For this reason, how to design and develop a light sensing circuit with dark current compensation function becomes the most important issue for the electronic engineers. FIG. 5 shows a schematic framework view of a light sensing circuit with dark current compensation function, wherein the light sensing circuit 14' with dark current compensation function ("light sensing circuit", hereinafter) comprises: a silicon substrate 141', a first diffusion region 142', a second diffusion region 143', a metal cover 144', and a calculation unit 145'. It is worth explaining that, the first diffusion region 142' and the silicon substrate 141' constitute a first photodiode, and a second photodiode is formed by the second diffusion region 143' and the silicon substrate 141'. During the operation of the light sensing circuit 14', the first photodiode would correspondingly output a first photodiode current $I_1'$ after receiving an irradiation light (i.e., an ambient light). In the meantime, the second photodiode would still output a second photodiode current $I_2'$ with the variation of an ambient temperature even though it is unable to receive the identical irradiation light due to the shielding of the metal cover 144'.

Because the first diffusion region 142' and the second diffusion region 143' have the same area size, the intensity level of the leakage current of the first photodiode should be equal to the second photodiode's. Therefore, by using the calculation unit 145' to apply a subtraction process to the first photodiode current $I_1'$ and the second photodiode current $I_1'$, an output current $I_{out}'$ been treated with a leakage current compensating process can be generated and outputted by the light sensing circuit 14'.

The light sensing circuit 14' of FIG. 5 cancels the dark current of the first photodiode through the dark current of the second photodiode. However, it must note that, photodiode dark current also varies with manufacturing errors of CMOS process besides ambient temperature. More particularly, manufacturing errors of CMOS process may cause the photodiode has interface defects and internal junction defects. As a result, the dark current of the first photodiode would not be equal to the second photodiode's despite the fact that the first diffusion region 142' and the second diffusion region 143' have the same layout area size. In such case, the dark current of the first photodiode is unable to be completely canceled by the dark current of the second photodiode during the operation of the light sensing circuit 14'.

From above descriptions, it is clear that there is no an ideal improvement approach or solution for perfectly eliminating the photodiode dark current in optical receiver circuits and/or ambient light sensing circuits; in view of that, inventors of the present application have made great efforts to make inventive research thereon and eventually provided a an optoelectronic receiver circuit with dark current correction function and a dark current correction method for the optoelectronic receiver circuit.

SUMMARY OF THE INVENTION

In view of the fact that conventional optoelectronic receiver circuit is unable to carry out a complete dark current correction, the primary objective of the present invention is to provide an optoelectronic receiver circuit with dark current correction function and a dark current correction method for the optoelectronic receiver circuit, wherein the optoelectronic receiver circuit with dark current correction comprises: a transimpedance amplifier (TIA), a first variable resistor, a second variable resistor, a photodiode, a leakage compensation photodiode, at least one first leakage correction photodiode, at least one first switch, at least one second leakage correction photodiode, and at least one second switch. In the present invention, the first switch and the second switch are used for enabling the first leakage correction photodiode and the second leakage correction photodiode when the dark current of the leakage compensation photodiode cannot fully cancel a leakage portion of a photodiode current generated by the photodiode, such that the leakage portion of the photodiode current can be completely eliminated by the dark current of the leakage compensation photodiode and the dark currents produced by the two leakage correction photodiodes.

In order to achieve the primary objective of the present invention, the inventor of the present invention provides an embodiment for the optoelectronic receiver circuit, comprising:

a transimpedance amplifier, having a positive input end, a negative input end, a positive output end, and a negative output end;

a first variable resistor, being electrically connected between the positive input end and the negative output end of the transimpedance amplifier;

a second variable resistor, being electrically connected between the negative input end and the positive output end of the transimpedance amplifier;

a photodiode, being electrically connected to the positive input end of the transimpedance amplifier;

a leakage compensation photodiode, being electrically connected to the negative input end of the transimpedance amplifier;

a plurality of first leakage correction photodiodes, being electrically connected to the positive input end of the transimpedance amplifier, and electrically connected in parallel with the photodiode;

a plurality of first switches, wherein any one of the first switches is connected between a corresponding one of the first leakage correction photodiodes and the positive input end of the transimpedance amplifier;

a plurality of second leakage correction photodiodes, being electrically connected to the negative input end of the transimpedance amplifier, and electrically connected in parallel with the leakage compensation photodiode; wherein all the leakage compensation photodiode, the first leakage correction photodiodes and the second leakage correction photodiodes is provided with a light isolation cover thereon, such that the leakage compensation photodiode, the first leakage correction photodiodes and the second leakage correction photodiodes are unable to receive any light; and a plurality of second switches, wherein any one of the second switches is connected between a corresponding one of the second leakage correction photodiodes and the negative input end of the transimpedance amplifier.

In the embodiment of the optoelectronic receiver circuit, further comprising:

an analog-to-digital converter, being electrically connected to the positive output end and the negative output end for receiving a positive output voltage and a negative output voltage of the transimpedance amplifier; and a micro controller, being electrically connected to the analog-to-digital converter, the first switches and the second switches;

wherein the micro controller is configured to adjust the resistance of the first variable resistor and the second variable resistor so as to make the transimpedance amplifier output a fully-differential driving signal to the analog-to-digital converter;

wherein the analog-to-digital converter is driven by the fully-differential driving signal so as to output a digital signal with a dark current digital portion to the micro controller, such that the micro controller is able to correct or remove the dark current digital portion from the digital signal by switching part or all of the first switches and the second switches to short circuit or open circuit.

Moreover, for achieving the primary objective of the present invention, the inventor of the present invention further provides an embodiment for the dark current correction method, which comprises following steps:

(1) providing an optoelectronic receiver circuit comprising:
a transimpedance amplifier, having a positive input end, a negative input end, a positive output end, and a negative output end;

a first variable resistor, being electrically connected between the positive input end and the negative output end of the transimpedance amplifier;

a second variable resistor, being electrically connected between the negative input end and the positive output end of the transimpedance amplifier;

a photodiode, being electrically connected to the positive input end of the transimpedance amplifier;

a leakage compensation photodiode, being electrically connected to the negative input end of the transimpedance amplifier;

a plurality of first leakage correction photodiodes, being electrically connected to the positive input end of the transimpedance amplifier, and electrically connected in parallel with the photodiode;

a plurality of first switches, wherein any one of the first switches is connected between a corresponding one of the first leakage correction photodiodes and the positive input end of the transimpedance amplifier;

a plurality of second leakage correction photodiodes, being electrically connected to the negative input end of the transimpedance amplifier, and electrically connected in parallel with the leakage compensation photodiode; wherein all the leakage compensation photodiode, the first leakage correction photodiodes and the second leakage correction photodiodes is provided with a light isolation cover thereon, such that the leakage compensation photodiode, the first leakage correction photodiodes and the second leakage correction photodiodes are unable to receive any light; and a plurality of second switches, wherein any one of the second switches is connected between a corresponding one of the second leakage correction photodiodes and the negative input end of the transimpedance amplifier;

(2) determining whether a positive output signal and a negative signal outputted by the transimpedance amplifier constitute a fully-differential driving signal or not; if yes, proceeding to step (4); otherwise, proceeding to step (3);

(3) using the micro controller to adjust the resistance of the first variable resistor and the second variable resistor, so as to make the positive output signal and the negative output signal constitute the fully-differential driving signal;

(4) letting the transimpedance amplifier output the fully-differential driving signal to an analog-to-digital converter, so as to make the analog-to-digital converter output a digital signal with a dark current digital portion to the micro controller;

(5) determining whether the dark current digital portion is adjusted to minimum or not by the micro controller; if yes, proceeding to step (7); otherwise, proceeding to step (6);

(6) by using the micro controller, at least one first switch being switched to short circuit for making at least one first leakage correction photodiode be electrically connected in parallel with the photodiode; moreover, at least one second switch also being switched to short circuit for making at least one second leakage correction photodiode be electrically connected in parallel with the leakage compensation photodiode; then, repeating the step (5); and (7) ending the steps.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 7A, FIG. 7B and FIG. 7C show flow charts of a dark current correction method according to the present invention.

DETAILED DESCRIPTION OF THE PREFERRED EMBODIMENTS

To more clearly describe an optoelectronic receiver circuit with dark current correction function and a dark current correction method for the optoelectronic receiver circuit according to the present invention, embodiments of the present invention will be described in detail with reference to the attached drawings hereinafter.

Figure 1:
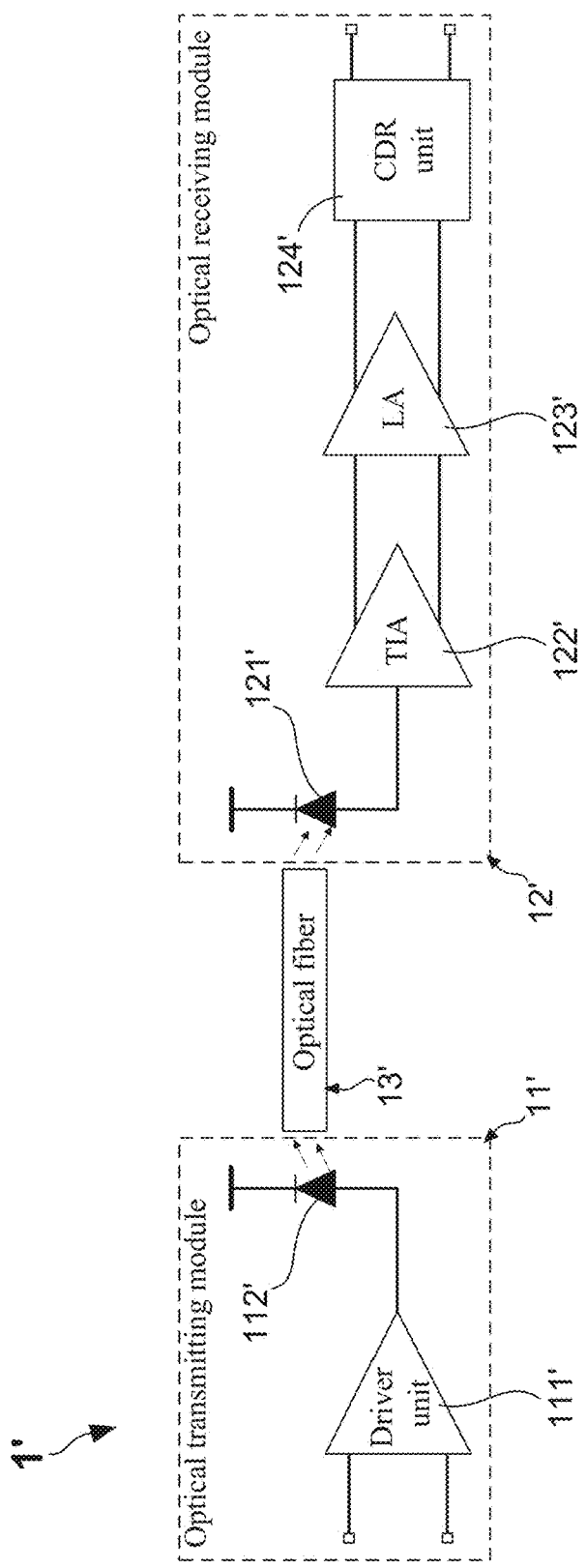
FIG. 1 shows a circuit framework diagram of a conventional optical communication system.
Figure 2:
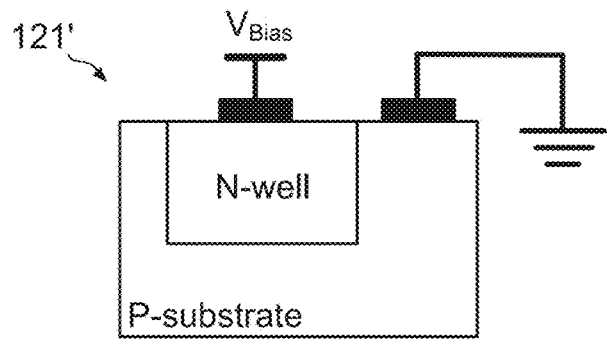
FIG. 2 shows a cross-sectional diagram of a photodiode with N-well/P-sub structure.
Figure 3:
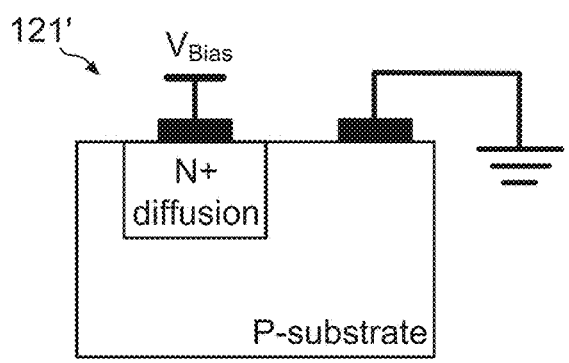
FIG. 3 shows a cross-sectional diagram of a photodiode with N+/P-sub structure.
Figure 4:
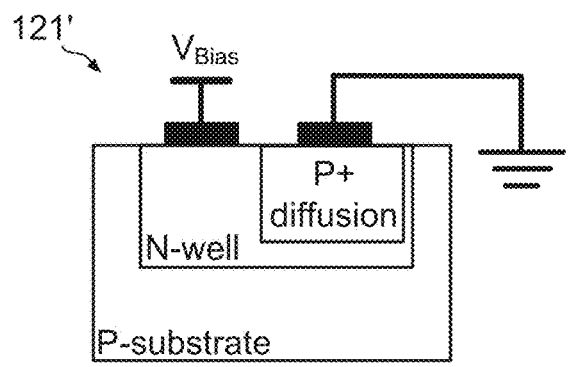
FIG. 4 shows a cross-sectional diagram of a photodiode with P+/N-well/P-sub structure.
Figure 5:
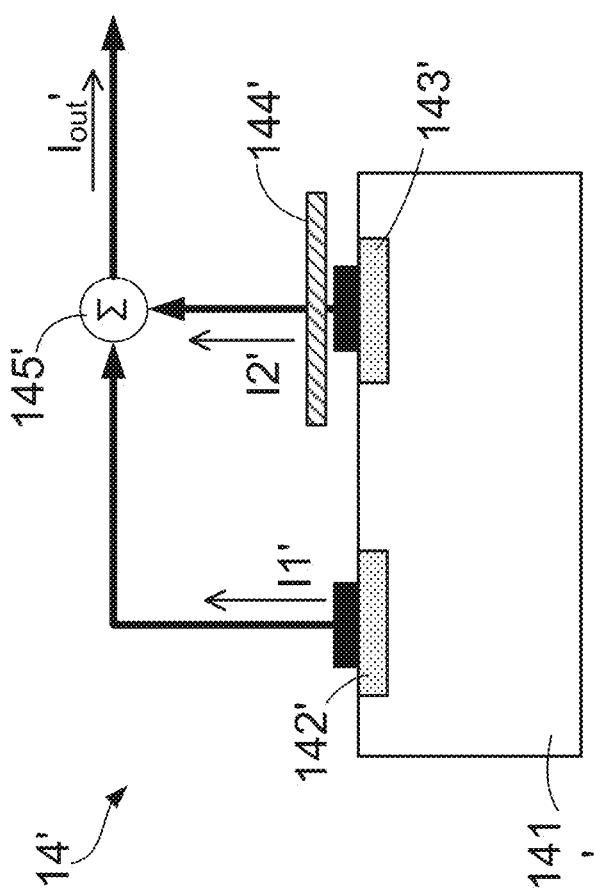
FIG. 5 shows a schematic framework view of a light sensing circuit with dark current compensation function.
Figure 6:
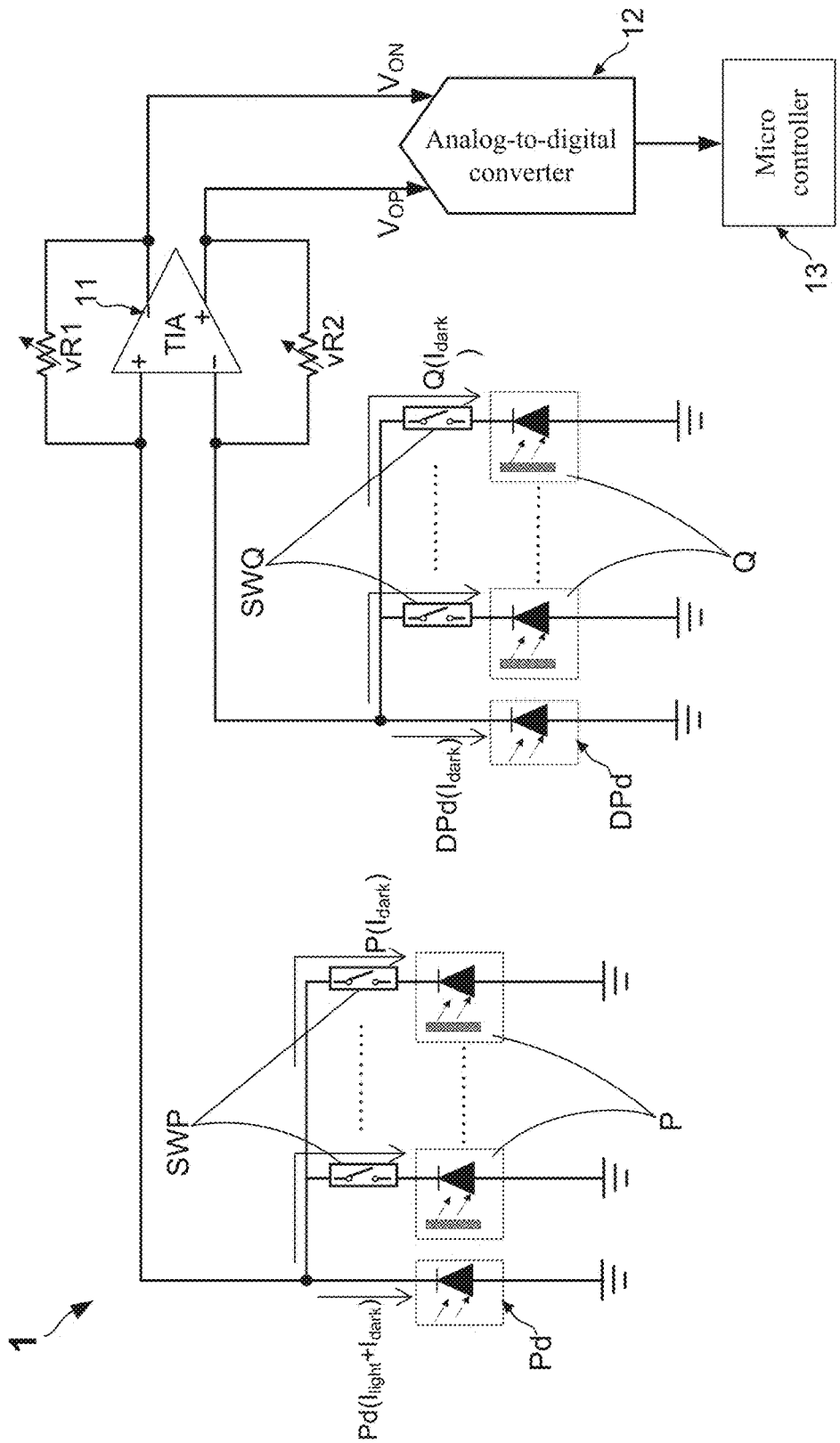
FIG. 6 shows a circuit framework diagram of an optoelectronic receiver circuit with dark current correction function according to the present invention.

With reference to FIG. 6, there is provided a circuit framework diagram of an optoelectronic receiver circuit with dark current correction function according to the present invention. As FIG. 6 shows, the optoelectronic receiver circuit 1 of the present invention comprises: a transimpedance amplifier (TIA) 11, a first variable resistor vR1, a second variable resistor vR2, a photodiode PD, a leakage compensation photodiode dPD, M number of first leakage correction photodiodes P, M number of first switches SWP, N number of second leakage correction photodiodes Q, and N number of second switches SWQ.

It is worth noting that, the TIA 11 is an FD-TIA (i.e., fully differential transimpedance amplifier) and has a positive input end, a negative input end, a positive output end, and a negative output end. On the other hand, the first variable resistor vR1 is electrically connected between the positive input end and the negative output end of the TIA 11, and the second variable resistor vR2 is electrically connected between the negative input end and the positive output end of the TIA 11. According to the present invention, the photodiode PD is electrically connected to the positive input end of the TIA 11, and the leakage compensation photodiode dPD is electrically connected to the negative input end of the TIA 11. It is worth explaining that, in the present invention, the M number of first leakage correction photodiodes P are electrically connected to the positive input end of the TIA 11; moreover, any one of the first switches SWP is connected between a corresponding one of the first leakage correction photodiodes P and the positive input end of the TIA 11. By such circuit arrangement, at least one first leakage correction photodiode P can be electrically connected in parallel with the photodiode PD after using a micro controller 13 to switch at least one first switch SWP to short circuit.

On the other hand, the N number of second leakage correction photodiodes Q are electrically connected to the negative input end of the TIA 11; moreover, any one of the second switches SWQ is connected between a corresponding one of the second leakage correction photodiodes Q and the negative input end of the TIA 11. Therefore, at least one second leakage correction photodiode Q can be electrically connected in parallel with the leakage compensation photodiode dPD through using the micro controller 13 to switch at least one second switch SWQ to short circuit. It is worth explaining that, in the case of the first switches SWP and the second switched SWQ being switched to open circuit as well as both the first variable resistor vR1 and the second variable resistor vR2 having the same resistance of $R_F$, a positive output signal $V_{OP}$ and a negative output signal $V_{ON}$ of the TIA 11 can be represented by following equation (1):

$$V_{(OP,ON)} = R_F\{[Pd(I_{light}+I_{dark})]-[DPd(I_{dark})]\} \quad (1)$$

In the equation (1), $Pd(I_{light}+I_{dark})$ means a summation of a photodiode current and a dark current generated by the photodiode PD, and $DPd(I_{dark})$ represents the dark current of the leakage compensation photodiode dPD. It is understood that, the input signal of the TIA 11 would include dark current portions still not been eliminated in the case of $DPd(I_{dark}) \neq Pd(I_{dark})$, such that not only the photodiode current $Pd(I_{light})$ but also the dark current $Pd(I_{dark})$ of the photodiode PD would be treated with a single-ended-to-differential conversion by the TIA 11. As a result, the positive output signal $V_{OP}$ and the negative signal $V_{ON}$ outputted by the TIA 11 fail to constitute a fully-differential driving signal. In such case, an analog-to-digital converter 12 electrically connected to the positive output end and the negative output end of the TIA 11 would not be fully driven by the positive output signal $V_{OP}$ and the negative signal $V_{ON}$.

Engineers skilled in field of complementary metal oxide semiconductor (CMOS) process and development of electronic circuits should know that, photodiode dark current would vary with manufacturing errors of CMOS process. More particularly, manufacturing errors of CMOS process may cause the photodiode has interface defects and internal junction defects. As a result, the dark current of the one photodiode would not be equal to the other one photodiode's despite the fact that these two photodiodes have the same layout area size (i.e., diffusion area size). For this reason, in the present invention, the micro controller 13 is configured to switch at least one first switch SWP and at least one second switch SWQ to short circuit when the dark current of the leakage compensation photodiode dPD is not equal to the photodiode's. Therefore, after the at least one first switch SWP and the at least one second switch SWQ are switched to short circuit, at least one first leakage correction photodiode P is electrically connected in parallel with the photodiode PD and at least one second leakage correction photodiode Q is electrically connected in parallel with the leakage compensation photodiode dPD. In addition, It is worth explaining that, in the case of the first switches SWP and the second switched SWQ being switched to short circuit as well as both the first variable resistor vR1 and the second variable resistor vR2 having the same resistance of $R_F$, a positive output signal $V_{ON}$ and a negative output signal $V_{ON}$ of the TIA 11 can be represented by following equation (2):

$$V_{(OP,ON)} = R_F\{[Pd(I_{light}+I_{dark})+M \times P(I_{dark})]-[DPd(I_{dark})+N \times Q(I_{dark})]\} \quad (2)$$

In the equation (2), $P(I_{dark})$ means a dark current generated by the first leakage correction photodiode P, and Q($I_{dark}$) represents a dark current of the second leakage correction photodiode Q. Moreover, M and N represent the total number of the first leakage correction photodiode P and the second leakage correction photodiode Q been enabled (or used) in the optoelectronic receiver circuit 1, respectively. Herein, it is understood that, the input signal of the TIA 11 would not include any dark current portions in the case of [Pd($I_{dark}$)+M×P($I_{dark}$)]−[DPd($I_{dark}$)+N×Q($I_{dark}$)]=0. Therefore, the positive output signal $V_{OP}$ and the negative signal $V_{ON}$ outputted by the TIA 11 constitute a fully-differential driving signal for completely driving the analog-to-digital converter 12 to output a digital signal with a dark current digital portion to the micro controller 13. After that, the micro controller 13 is able to correct or remove the dark current digital portion from the digital signal by switching part or all of the first switches SWP and the second switches SWQ to short circuit. Briefly speaking, the digital signal of the analog-to-digital converter 12 would not include any dark current digital portion as long as the value of [Pd ($I_{dark}$)+M×P($I_{dark}$)]−[DPd($I_{dark}$)+N×Q($I_{dark}$)] is adjusted to approach zero.

It must emphasize that, the micro controller 13 is electrically connected to the first variable resistor vR1, the second variable resistor vR2, the analog-to-digital converter 12, the first switches SWP, and the second switches SWQ, but FIG. 6 does not fully depict all connection lines (or wires) between the micro controller 13 and those circuit units electrically connected to the micro controller 13. The reason why all the connection lines does not be shown in FIG. 6 is that multi and complicated connection lines are concerned to cause the circuit framework diagram of FIG. 6 be disarray. However, such circuit framework presenting way of FIG. 6 would not prohibit the understanding and practice of this optoelectronic receiver circuit 1 for the electronic engineers.

Figure 7B:
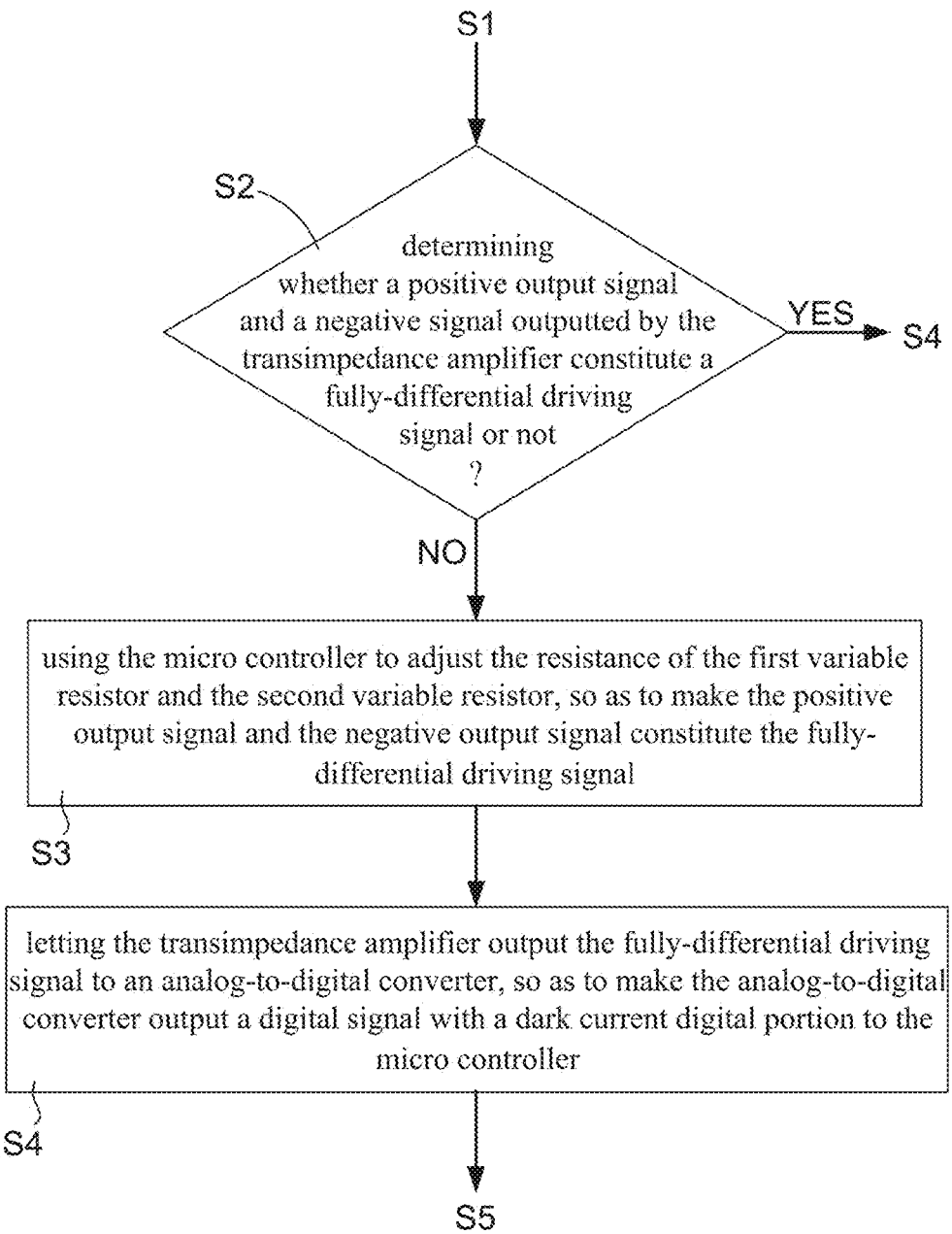
Figure 7C:
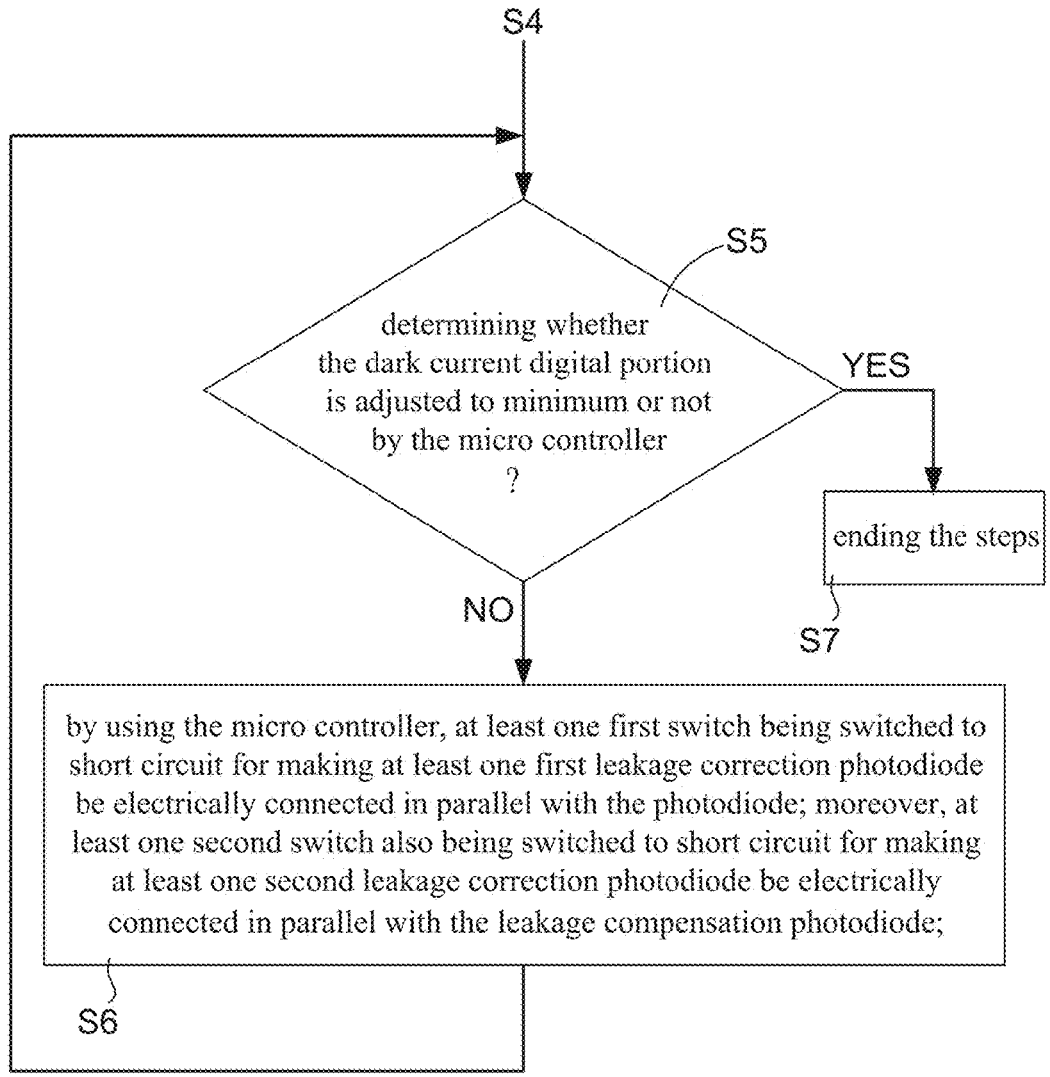

In addition, for facilitating this optoelectronic receiver circuit automatically execute the dark current correction function, the present invention also proposes a dark current correction method. FIG. 7A, FIG. 7B and FIG. 7C show flow charts of a dark current correction method according to the present invention. As FIG. 7A, FIG. 7B and FIG. 7C show, the dark current correction method mainly comprising following steps:

Step (S1): providing an optoelectronic receiver circuit comprising:
- a transimpedance amplifier (TIA) 11;
- a first variable resistor vR1 electrically connected between a positive input end and a negative output end of the TIA 11;
- a second variable resistor vR2 electrically connected between a negative input end and a positive output end of the TIA 11;
- a photodiode PD electrically connected to the positive input end of the TIA 11;
- a leakage compensation photodiode dPD electrically connected to the negative input end of the TIA 11;
- a plurality of first leakage correction photodiodes electrically connected to the positive input end of the TIA 11 and also electrically connected in parallel with the photodiode PD;
- a plurality of first switches SWP, wherein any one of the first switches SWP is connected between a corresponding one of the first leakage correction photodiodes P and the positive input end of the TIA 11;
- a plurality of second leakage correction photodiodes SWQ electrically connected to the negative input end of the transimpedance amplifier and also electrically connected in parallel with the leakage compensation photodiode; and
- a plurality of second switches SWQ, wherein any one of the second switches SWQ is connected between a corresponding one of the second leakage correction photodiodes Q and the negative input end of the TIA 11;

Step (S2): determining whether a positive output signal $V_{OP}$ and a negative signal $V_{ON}$ outputted by the TIA 11 constitute a fully-differential driving signal or not; if yes, proceeding to step (S4); otherwise, proceeding to step (S3);

Step (S3): using a micro controller 13 to adjust the resistance of the first variable resistor vR1 and the second variable resistor vR2, so as to make the positive output signal $V_{OP}$ and the negative output signal $V_{ON}$ constitute the fully-differential driving signal;

Step (S4): letting the TIA 11 output the fully-differential driving signal to an analog-to-digital converter 12, so as to make the analog-to-digital converter 12 output a digital signal with a dark current digital portion to the micro controller 13;

Step (S5): determining whether the dark current digital portion is adjusted to minimum or not by the micro controller 13; if yes, proceeding to step (S7); otherwise, proceeding to step (S6);

Step (S6): by using the micro controller 13, at least one first switch SWP being switched to short circuit for making at least one first leakage correction photodiode P be electrically connected in parallel with the photodiode PD; moreover, at least one second switch SWQ also being switched to short circuit for making at least one second leakage correction photodiode Q be electrically connected in parallel with the leakage compensation photodiode dPD; then, repeating the step (5); and Step (S7): ending the steps.

In the step (S3), the resistance of the first variable resistor vR1 and the second variable resistor vR2 are adjusted based on a resistance adjusting signal generated by the micro controller 13. Moreover, in the step (S6), the first switch SWP and the second switch SWQ are switched to short circuit according to a switch controlling signal generated by the micro controller 13.

Therefore, through above descriptions, the optoelectronic receiver circuit with dark current correction function and the dark current correction method of the present invention have been introduced completely and clearly; in summary, the present invention includes the advantages of:

(1) In view of the fact that conventional optoelectronic receiver circuit is unable to carry out a complete dark current correction, the present invention particularly discloses an optoelectronic receiver circuit 1, which comprises: a transimpedance amplifier (TIA) 11, a first variable resistor vR1, a second variable resistor vR2, a photodiode PD, a leakage compensation photodiode dPD, at least one first leakage correction photodiode P, at least one first switch SWP, at least one second leakage correction photodiode Q, and at least one second switch SWQ. In the present invention, the first switch SWP and the second switch SWQ are used for enabling or activating the first leakage correction photodiode P and the second leakage correction photodiode Q when the dark current of the leakage compensation photodiode dPD cannot fully cancel a leakage portion of a photodiode current generated by the photodiode PD, such that the leakage portion of the photodiode current can be completely eliminated by the dark current of the leakage compensation photodiode dPD and the dark currents produced by the two leakage correction photodiodes (P, Q).

The above description is made on embodiments of the present invention. However, the embodiments are not intended to limit scope of the present invention, and all equivalent implementations or alterations within the spirit of the present invention still fall within the scope of the present invention.

What is claimed is:

1. An optoelectronic receiver circuit with dark current correction function, comprising:
    a transimpedance amplifier, having a positive input end, a negative input end, a positive output end, and a negative output end;
    a first variable resistor, being electrically connected between the positive input end and the negative output end of the transimpedance amplifier;
    a second variable resistor, being electrically connected between the negative input end and the positive output end of the transimpedance amplifier;
    a photodiode, being electrically connected to the positive input end of the transimpedance amplifier;
    a leakage compensation photodiode, being electrically connected to the negative input end of the transimpedance amplifier;
    a plurality of first leakage correction photodiodes, being electrically connected to the positive input end of the transimpedance amplifier, and electrically connected in parallel with the photodiode;
    a plurality of first switches, wherein any one of the first switches is connected between a corresponding one of the first leakage correction photodiodes and the positive input end of the transimpedance amplifier;
    a plurality of second leakage correction photodiodes, being electrically connected to the negative input end of the transimpedance amplifier, and electrically connected in parallel with the leakage compensation photodiode; wherein all the leakage compensation photodiode, the first leakage correction photodiodes and the second leakage correction photodiodes is provided with a light isolation cover thereon, such that the leakage compensation photodiode, the first leakage correction photodiodes and the second leakage correction photodiodes are unable to receive any light; and
    a plurality of second switches, wherein any one of the second switches is connected between a corresponding one of the second leakage correction photodiodes and the negative input end of the transimpedance amplifier.

2. The optoelectronic receiver circuit of claim 1, further comprising:
    an analog-to-digital converter, being electrically connected to the positive output end and the negative output end for receiving a positive output voltage and a negative output voltage of the transimpedance amplifier; and
    a micro controller, being electrically connected to the analog-to-digital converter, the first switches and the second switches;
    wherein the micro controller is configured to adjust the resistance of the first variable resistor and the second variable resistor so as to make the transimpedance amplifier output a fully-differential driving signal to the analog-to-digital converter;
    wherein the analog-to-digital converter is driven by the fully-differential driving signal so as to output a digital signal with a dark current digital portion to the micro controller, such that the micro controller is able to correct or remove the dark current digital portion from the digital signal by switching part or all of the first switches and the second switches to short circuit or open circuit.

3. The optoelectronic receiver circuit of claim 1, wherein both the first variable resistor and the second variable resistor are a voltage-controlled resistor comprising at least one transistor.

4. A dark current correction method, comprising following steps:
    (1) providing an optoelectronic receiver circuit comprising:
        a transimpedance amplifier;
        a first variable resistor electrically connected between a positive input end and a negative output end of the transimpedance amplifier;
        a second variable resistor electrically connected between a negative input end and a positive output end of the transimpedance amplifier;
        a photodiode electrically connected to the positive input end of the transimpedance amplifier;
        a leakage compensation photodiode electrically connected to the negative input end of the transimpedance amplifier;
        a plurality of first leakage correction photodiodes, being electrically connected to the positive input end of the transimpedance amplifier, and also electrically connected in parallel with the photodiode;
        a plurality of first switches, wherein any one of the first switches is connected between a corresponding one of the first leakage correction photodiodes and the positive input end of the transimpedance amplifier;
        a plurality of second leakage correction photodiodes electrically, being connected to the negative input end of the transimpedance amplifier, and also electrically connected in parallel with the leakage compensation photodiode; wherein all the leakage compensation photodiode, the first leakage correction photodiodes and the second leakage correction photodiodes is provided with a light isolation cover thereon, such that the leakage compensation photodiode, the first leakage correction photodiodes and the second leakage correction photodiodes are unable to receive any light; and
        a plurality of second switches, wherein any one of the second switches is connected between a corresponding one of the second leakage correction photodiodes and the negative input end of the transimpedance amplifier;
    (2) determining whether a positive output signal and a negative signal outputted by the transimpedance amplifier constitute a fully-differential driving signal or not; if yes, proceeding to step (4); otherwise, proceeding to step (3);
    (3) using a micro controller to adjust the resistance of the first variable resistor and the second variable resistor, so as to make the positive output signal and the negative output signal constitute the fully-differential driving signal;
    (4) letting the transimpedance amplifier output the fully-differential driving signal to an analog-to-digital converter, so as to make the analog-to-digital converter output a digital signal with a dark current digital portion to the micro controller;

(5) determining whether the dark current digital portion is adjusted to minimum or not by the micro controller; if yes, proceeding to step (7); otherwise, proceeding to step (6);

(6) by using the micro controller, at least one first switch being switched to short circuit for making at least one first leakage correction photodiode be electrically connected in parallel with the photodiode; moreover, at least one second switch also being switched to short circuit for making at least one second leakage correction photodiode be electrically connected in parallel with the leakage compensation photodiode; then, repeating the step (5); and (7) ending the steps.

5. The dark current correction method of claim 4, wherein the first switch and the second switch are switched to short circuit according to a switch controlling signal generated by the micro controller.

6. The dark current correction method of claim 4, wherein the resistance of the first variable resistor and the second variable resistor are adjusted based on a resistance adjusting signal generated by the micro controller.

* * * * *